United States Patent
Kawakami et al.

(10) Patent No.: US 8,654,576 B2
(45) Date of Patent: Feb. 18, 2014

(54) SPIN VALVE ELEMENT, METHOD OF DRIVING THE SAME, AND STORAGE DEVICE USING THE SAME

(75) Inventors: Haruo Kawakami, Miura (JP); Yasushi Ogimoto, Higashiyamato (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 504 days.

(21) Appl. No.: 12/992,864

(22) PCT Filed: Sep. 5, 2008

(86) PCT No.: PCT/JP2008/066076
§ 371 (c)(1),
(2), (4) Date: Jan. 14, 2011

(87) PCT Pub. No.: WO2010/007695
PCT Pub. Date: Jan. 21, 2010

(65) Prior Publication Data
US 2011/0102939 A1 May 5, 2011

(30) Foreign Application Priority Data
Jul. 14, 2008 (JP) ................................. 2008-182651

(51) Int. Cl.
*G11C 11/00* (2006.01)

(52) U.S. Cl.
USPC .................. 365/158; 365/46; 365/55; 365/74; 365/97; 365/100; 365/131; 365/148; 365/171; 365/173; 365/163

(58) Field of Classification Search
USPC ......... 365/46, 55, 74, 97, 100, 131, 148, 158, 365/171, 173, 163
See application file for complete search history.

(56) References Cited

U.S. PATENT DOCUMENTS

| | | | |
|---|---|---|---|
| 5,862,022 | A | 1/1999 | Noguchi et al. |
| 5,864,644 | A | 1/1999 | DiGiovanni et al. |
| 5,999,673 | A | 12/1999 | Valentin et al. |
| 6,654,278 | B1 | 11/2003 | Engel et al. |
| 7,209,615 | B2 | 4/2007 | Fishteyn |
| 8,084,835 | B2 * | 12/2011 | Ranjan et al. ............. 257/421 |

(Continued)

FOREIGN PATENT DOCUMENTS

| | | |
|---|---|---|
| JP | 10-091925 A | 4/1998 |
| JP | 2003-031771 A | 1/2003 |

(Continued)

OTHER PUBLICATIONS

M. Rahm et al., Influence of point defects on magnetic vortex structures, Journal of Applied Physics, Jun. 1, 2004, vol. 95, No. 11, pp. 6708-6710.

(Continued)

*Primary Examiner* — Fernando Hidalgo
(74) *Attorney, Agent, or Firm* — Rabin & Berdo, P.C.

(57) ABSTRACT

Provided is a spin valve element capable of performing multi-value recording, which includes a pair of ferromagnetic layers having different coercivities from each other, and sandwiching an insulating layer or a non-magnetic layer. The ferromagnetic layer having the smaller coercivity has a substantially circular in-plane profile, and a plurality of island-shaped non-magnetic portions $I_N$, $I_E$, $I_W$, and $I_S$ are included. In addition, a storage device is manufactured by using such a spin valve element.

18 Claims, 10 Drawing Sheets

(56) References Cited

U.S. PATENT DOCUMENTS

| | | | |
|---|---|---|---|
| 2004/0012994 A1* | 1/2004 | Slaughter et al. | 365/158 |
| 2008/0112094 A1* | 5/2008 | Kent et al. | 360/324.11 |
| 2008/0191295 A1* | 8/2008 | Ranjan et al. | 257/421 |
| 2009/0180311 A1* | 7/2009 | Ono et al. | 365/158 |

FOREIGN PATENT DOCUMENTS

| | | |
|---|---|---|
| JP | 2005-535111 T | 11/2005 |
| JP | 2005-535115 T | 11/2005 |
| JP | 2007-317895 A | 12/2007 |
| WO | WO-2004/010436 A1 | 1/2004 |
| WO | WO-2004/012197 | 2/2004 |
| WO | WO-2007/105385 A1 | 9/2007 |

OTHER PUBLICATIONS

Anand Subra Mani et al., Effect of Controlled Asymmetry on the Switching Characteristics of Ring-Based MRAM Design, IEEE Transaction on Nanotechnology, May 2006, vol. 5, No. 3, pp. 249-254.

Junya Shibata et al., "Current-induced magnetic vortex motion by spin-transfer torque", Physical Review B 73, 020403(R) (2006).

B.A. Ivanov et al., "Excitation of Spin Dynamics by Spin-Polarized Current in Vortex State Magnetic Disks", Physical Review Letters, PRL 99, 247208 (2007).

* cited by examiner

VORTEX

ISLAND-SHAPED
NON-MAGNETIC
PORTION
(CIRCULAR DOT)

SPIN VALVE ELEMENT, METHOD OF DRIVING THE SAME, AND STORAGE DEVICE USING THE SAME

CROSS-REFERENCE TO RELATED APPLICATIONS

This application is a national stage application under 35 U.S.C. §371 of International Application No. PCT/JP2008/66076, filed Sep. 5, 2008, and claims the benefit under 35 U.S.C. §119 of the earlier filing date of Japanese Patent Application 2008-182651, filed Jul. 14, 2008. International Application No. PCT/JP2008/66076 and Japanese Patent Application 2008-182651 are hereby incorporated herein in their entirety by reference.

TECHNICAL FIELD

The present invention relates to a spin valve element capable of writing and reading information by controlling distribution of magnetization of a ferromagnetic layer, a method of driving the same, and a storage device using the same.

BACKGROUND ART

In the related art, with recent progress in nano-electronics, products utilizing physical phenomena inherent in minute-sized magnetic materials have been developed. Particularly developments are rapid in the technical fields using the spin of free electrons in the magnetic materials (hereinafter, referred to as "spin electronics").

In the field of spin electronics, the most realistic application is a spin valve element utilizing a tunneling magnetoresistance (TMR) effect which occurs in a multi-layered structure including a ferromagnetic layer/an insulating layer/a ferromagnetic layer and a giant magnetoresistance (GMR) effect which occurs in a multi-layered structure including a ferromagnetic layer/a non-magnetic layer (conductive layer)/a ferromagnetic layer. Herein, the symbol of slash "/" written between layers represents that the layers before and after the symbol are stacked in order.

FIGS. 1 and 2 illustrate examples of the structure of a conventional spin valve element. FIG. 1 illustrates a basic configuration of a spin valve element utilizing the TMR effect. The spin valve element is configured to include an insulating layer 30, an insulating layer 24, a pair of ferromagnetic layers (a pinned layer 23 and a free layer 25) that sandwiches the insulating layer 24, and electrode layers 21 and 27, in which all the above layers are formed on a substrate 5. If necessary, an anti-ferromagnetic layer (pinning layer) 22, a capping layer 26, or the like may be further included. Magnetization of the pinned layer 23 is pinned by magnetic coupling with the anti-ferromagnetic layer 22. Magnetization of the free layer 25 is controlled by the external magnetic field or the spin injection originating from a spin-polarized current.

In the control using the spin injection, if electrons are caused to flow to an element from the pinned layer 23, a spin torque is exerted on the spin of the free layer 25 such that the spin of the free layer 25 becomes parallel to that of the pinned layer 23. On the other hand, if electrons are caused to flow from the free layer 25 to the pinned layer 23, a spin torque is exerted on the spin of the free layer 25 such that the spin of the free layer becomes anti-parallel to that of the pinned layer 23. Because of this action, the direction of the magnetization of the free layer 25 can be controlled by the direction of a current (magnetization reversal by spin injection).

In this manner, the direction of magnetization of the free layer is rotated, or reversed according to external magnetic field or spin injection originating from the spin-polarized current. Therefore, the resistance of the element greatly changes depending on the direction of the magnetization of the free layer with respect to that of the pinned layer. In other words, the element is configured to have the highest resistance value when the magnetization vectors of the two layers are in anti-parallel to each other and the lowest resistance value when the magnetization vectors of the two layers are in parallel to each other.

FIG. 2 illustrates a basic configuration of a spin valve element using the GMR effect, which is different from the spin valve element using the TMR effect illustrated in FIG. 1 in that the insulating layer 24 is substituted with a non-magnetic (conductive) layer 51, but other functions thereof are basically the same.

There has been proposed a solid state magnetic memory using such elements to record information, one bit per element. In addition, there has also been proposed a multi-value recording technology capable of recording information, two bits per element. In addition, since two states (two values) can be recorded for one bit, a total of four states (four values) can be recorded with 2 bits.

However, since the conventional multi-value recording technology still involves several problems, it has not yet come to the practicable stage. For example, JP-A No. 10-91925 discloses a solid state magnetic memory based on a multi-value recording technology capable of recording information, two bits per element, with use of a double-tunnel junction element having a multi-layered structure including a ferromagnetic layer/a first insulating layer (or a first non-magnetic layer)/a ferromagnetic layer/a second insulating layer (or second non-magnetic layer)/a ferromagnetic layer. In this solid state magnetic memory, the element needs to have multiple structures. Therefore, between one multi-layered structure including a ferromagnetic layer/a first non-magnetic layer/a ferromagnetic layer and the other multi-layered structure including a ferromagnetic layer/a second non-magnetic layer/a ferromagnetic layer, the output voltage level measured between the ferromagnetic layers in each structure is distinguishable. For this reason, in the solid state magnetic memory disclosed in JP-A No. 10-91925, if a magnetoresistance ratio of at least one of the two multi-layered structures included in the solid state magnetic memory is configured not to be larger than a magnetoresistance ratio of a TMR element having a single-tunnel junction of a structure including a ferromagnetic layer/a non-magnetic layer/a ferromagnetic layer (the other TMR type element), there is a problem in that a sufficient S/N ratio cannot be obtained.

JP-A No. 2003-31771 discloses a method of recording information, using a structure in which two ferromagnetic layers are multi-layered with a non-magnetic layer interposed therebetween in a manner such that the directions of the magnetizations of the ferromagnetic layers are perpendicular to each other. With such a combination, each of the ferromagnetic layers individually stores one bit, that is, a total of 2 bits. In other words, four states are recorded in the two ferromagnetic layers. However, this method is disadvantageous in that it requires multiple structures and it needs to perform a switching operation with use of the external magnetic field by generating two directional magnetic fields (forward and backward) for each ferromagnetic layer, that is, generating a total of four directional magnetic fields.

JP-A No. 2007-317895 discloses a structure in which two standby portions are disposed adjacent to a free layer and notches for pining magnetic walls are disposed so as to correspond to the standby portions. However, this technique has a problem with an increased area in the lateral direction due to the area occupied by the standby portions. For such a reason, although the multi-value recording is achieved, the improvement of the recording density is unsuccessful.

Japanese Patent Application National Publication (Laid-Open) No. 2005-535111 discloses a free layer that has plural stabilized sites thanks to the shape anisotropy of the free layer. However, this technique has a problem in that achievement of the shape anisotropy leads to warping of a shape (distortion) and an increase in the reversal magnetic field.

In addition, M. Rahm et al., "Influence of Point Defects on Magnetic Vortex Structures," Journal of Applied Physics, Vol. 95, 6708, American Institute of Physics, Jun. 1, 2004, discloses a configuration in which "defects" are disposed linearly on a circular magnetic film and vortexes of the magnetization are caused to be positioned at the defects.

In the configuration, determining at which defects the vortexes are to be positioned is controlled by the external magnetic field to implement plural magnetic states. However, according to this disclosure, since the arrangement of the "defects" serving as recoding points is limited to the linear fashion, practically it is difficult to increase the density of the recording points. In addition, Rahm et al. does not disclose a configuration of a spin valve element having a simple reading function.

In view of the above-mentioned problems, an object of the invention is to provide a multi-value recording spin valve element capable of allowing achievement of a high recording density without using a complicated structure such as multiple structures, a method of driving the spin valve element, and a storage device using the spin valve element.

SUMMARY OF THE INVENTION

According to one aspect of the invention, there is provided is a spin valve element having an intermediate layer, which includes an insulating layer or a non-magnetic layer, and a pair of ferromagnetic layers that sandwiches the intermediate layer, in which the pair of the ferromagnetic layers have different coercivities and at least the ferromagnetic layer having small coercivity has a substantially circular in-plane profile and plural island-shaped non-magnetic portions therein.

In the above aspect, the island-shaped non-magnetic portions may have a substantially circular in-plane profile.

In addition, in the above aspect, the plural island-shaped non-magnetic portions may be disposed on a concentric circle having the center that is substantially the same as that of an outer shape of the spin valve element.

According to another aspect of the invention, there is provided is a method of driving a spin valve element. More specifically, the invention provides a method of driving a spin valve element that includes changing a position of a vortex of a vortex-shaped magnetization from one island-shaped non-magnetic portion to another island-shaped non-magnetic portion by applying an in-plane magnetic field to the ferromagnetic layer having small coercivity.

In addition, in the above aspect of the method of driving the spin valve element, a direction of the in-plane magnetic field may not be aligned with a direction passing through two island-shaped non-magnetic portions.

In addition, according to a further aspect of the invention, there is provided another method of driving a spin valve element. More specifically, there is provided a method of driving the spin valve element according to any one of the above disclosures. The method includes moving a vortex of a vortex-shaped magnetization by applying a perpendicular magnetic field to the ferromagnetic layer having small coercivity, so that the vortex has a motion to rotate from a state in which the vortex lies at one island-shaped non-magnetic portion to a state in which the vortex lies at another island-shaped non-magnetic portion. In addition, there is further provided a method of driving the spin valve element according to any one of the above disclosures, the method including moving a vortex of a vortex-shaped magnetization by causing a current to flow such that the spin is injected from the ferromagnetic layer having large coercivity to the ferromagnetic layer having small coercivity, so that the vortex has a motion to rotate from a state in which the vortex lies at one island-shaped non-magnetic portion to a state in which the vortex lies at a neighboring island-shaped non-magnetic portion.

According to the invention, there is still further provided a storage device. More specifically, there is provided a storage device using as a storage element the spin valve element according to one of the above disclosures.

According to any one of the embodiments of the invention, it is possible to provide a multi-value recordable spin valve element having at least one effect such as achievement of high recording density without using a complicated structure such as multiple structures and realization of a spin valve element capable of performing multi-value recording with use of a unipolar pulse at the time of using spin injection magnetization reversal. In addition, it is possible to implement a storage device using such a spin valve element.

BRIEF DESCRIPTION OF THE DRAWINGS

FIGS. 4A and 4B are views for explaining a vortex-shaped magnetization structure, wherein FIG. 4A is a perspective view and FIG. 4B is a plan view indicating the magnetization by arrows.

FIGS. 5A and 5B are views for explaining the distribution of magnetization in a spin valve element obtained in the invention, wherein FIG. 5A is a perspective view and FIG. 5B is a plan view indicating magnetization by arrows.

FIGS. 10A, 10B and 10C are views for explaining distribution of magnetization in a spin valve element according to the invention, in which FIG. 10A illustrates a free layer, FIG. 10B illustrates a pinned layer having perpendicular magnetization anisotropy, and FIG. 10C illustrates a pinned layer having in-plane magnetization anisotropy.

FIGS. 11A and 11B are views for explaining an example of a structure of a spin injection type spin valve element according to the invention, in which FIG. 11A illustrates an example of a structure having a perpendicular magnetization pinned layer for writing and an in-plane magnetization pinned layer for reading and FIG. 11B illustrates an example of a structure having an electrode for in-plane spin injection and an in-plane magnetization pinned layer.

DETAILED DESCRIPTION OF THE INVENTION

Figure 1:
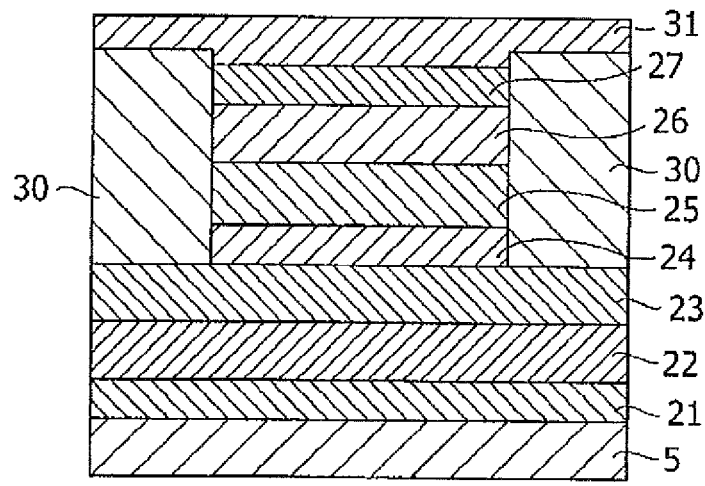
FIG. 1 is a cross-sectional view illustrating a basic configuration of a spin valve element using TMR.
Figure 2:
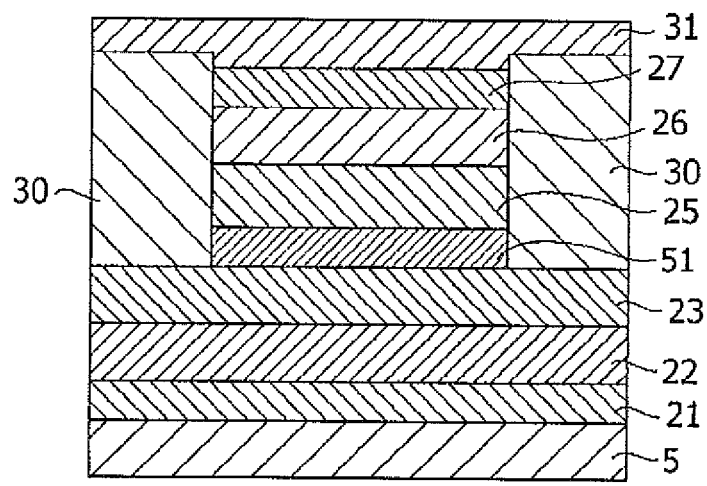
FIG. 2 is a cross-sectional view illustrating a basic configuration of a spin valve element using GMR.

In a spin valve element according to the invention, an in-plane profile of the spin valve element is configured to be substantially circular, and plural island-shaped non-magnetic areas (hereinafter, referred to as island-shaped non-magnetic portions) are formed on the in-plane. With the structure in which the in-plane profile is configured to be substantially circular and plural island-shaped non-magnetic portions are provided, in the spin valve element according to the invention, it is possible to reduce a shape anisotropy at the time of writing thereby to decrease a recording magnetic field and to realize a state in which vortexes of a magnetization pattern in the in-plane of a free layer is pinned at any of island-shaped dots pr at a certain number of island-shaped dots.

In this manner, multi-value recording can be implemented in the spin valve element according to the invention. According to such a configuration, a number of stabilized states as many as the number of incorporated island-shaped non-magnetic portions can be obtained depending on the distribution of magnetization of the free layer, and the multi-value recordable spin valve element can be realized in a simple configuration. More specifically, the vortexes formed in the free layer are pinned at the island-shaped non-magnetic portions, and are caused to move between the island-shaped non-magnetic portions from one to another by the application of the external magnetic field or the spin injection. In this manner, writing can be achieved by a control of determining an island-shaped non-magnetic portion at which the vortex is to be pinned and reading can be also achieved, with use of a spin valve structure, by identifying the island-shaped non-magnetic portion at which the vortex is pinned.

Particularly, by concentrically arranging the plural island-shaped non-magnetic portions along a concentric circle having the same center as the outer shape of the spin valve element, it is possible to increase the density of the island-shaped non-magnetic portions in the in-plane of the spin valve element compared to a spin valve element having island-shaped non-magnetic portions linearly arranged. In addition, such arrangement enables use of the meandering motion or the rotational motion of the vortex by the means that will be described below.

In addition, the island-shaped non-magnetic portions according to the invention can be basically configured in the form of a circular dot. When turning a magnetic layer of a minute-sized spin valve element into non-magnetic portions, an effective way of forming the non-magnetic portions is to form a pattern using a phenomenon of diffusion of a certain substance or heat. Accordingly, a circular shape is favorable in terms of ease of manufacturing.

In addition, as described above, the invention uses the configuration in which the vortex is pinned at a certain island-shaped non-magnetic portion. Hereinafter, embodiments of the invention will be described with reference to the drawings.

Figure 3:
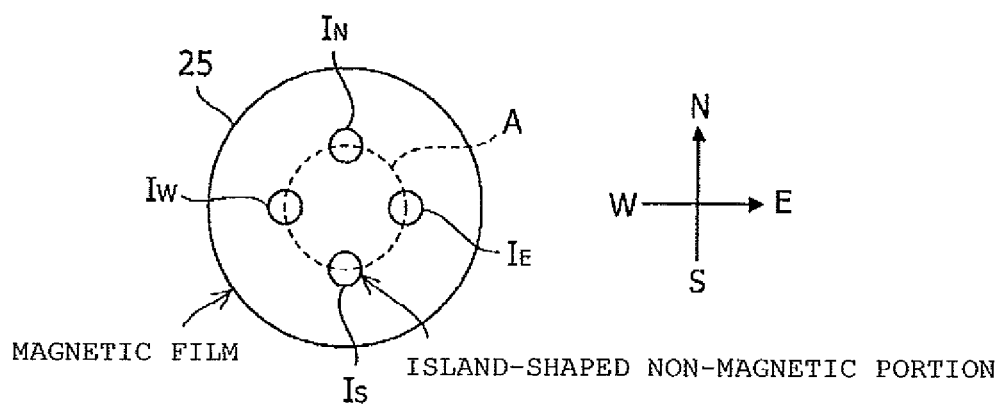
FIG. 3 is a view for explaining one example of an in-plane profile in a spin valve element according to the invention.

FIG. 3 illustrates an example of an embodiment of the invention. The basic form of the in-plane profile of the magnetic film constituting the free layer is a circle, and four island-shaped non-magnetic portions $I_N$, $I_E$, $I_W$, and $I_S$ each in the form of a circular dot that corresponds to the island-shaped non-magnetic portions are formed along the circumference of a circle A that is concentric with the outer circle of the magnetic film 25. The island-shaped non-magnetic portions $I_N$, $I_E$, $I_W$, and $I_S$ include arbitrary kinds, for example, island-shaped areas of a certain substance exhibiting non-magnetism or island-shaped areas configured to exhibit non-magnetism among areas in a magnetic film. In other words, they include areas which are caused to exhibit non-magnetism due to a structure in which a material for a film in the areas is different from that of other surrounding areas, areas formed in a manner such that a void is provided in a film and then the void is filled with a non-magnetic material, areas at which a material of the film is the same as that of other areas but the film at the areas is altered to be a non-magnetic layer by experiencing a heat process configured to give locally different heat conditions so as to alter the magnetism. Although FIG. 3 illustrates the island-shaped non-magnetic portions $I_N$, $I_E$, $I_W$, and $I_S$ in the form of a circular dot, the form is not necessarily strictly limited to a circle. In the invention, of the two ferromagnetic layers that are typically provided, the island-shaped non-magnetic portions are disposed in at least the free layer, that is, the layer having smaller coercivity. In addition to the free layer, areas of the non-magnetic layer (insulating layer), the pinned layer, or the like that are positioned corresponding to the island-shaped areas of the free layer may also be configured as the non-magnetic layer.

Figure 4A:
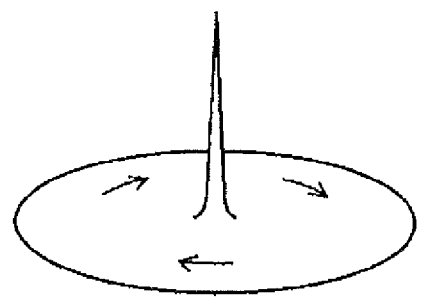
Figure 4B:
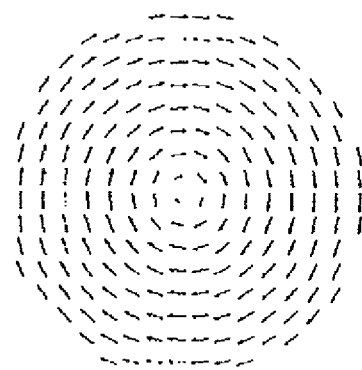
Figure 5A:
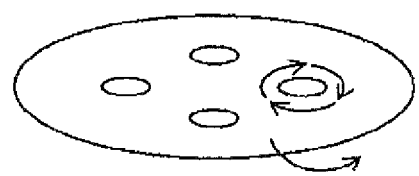
Figure 5B:
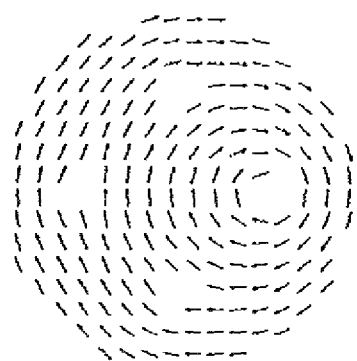

In addition, FIG. 4 illustrates comparison of the distribution of magnetization of the vortex in a configuration where a circular in-plane profile is provided but an island-shaped non-magnetic portion is not provided. As illustrated in FIG. 4B, the distribution of magnetization in the in-plane shows that the magnetizations are in anti-parallel at the center of the vortex structure, so that exchange energy increases. In order to reduce the increase in the exchange energy, the magnetization is changed to be in the perpendicular direction as illustrated in FIG. 4A. On the contrary, details of the distribution of the neighboring magnetizations obtained in the invention using the island-shaped non-magnetic portions $I_N$, $I_E$, $I_W$, and $I_S$ are illustrated in FIGS. 5A and 5B. In other words, the center of the vortex lies at one of the island-shaped non-magnetic portions (for example, the island-shaped non-magnetic portion $I_E$) and the distribution of magnetization is in the site shown in FIG. 5B where it looks like as if the island-shaped non-magnetic portion $I_E$ pins the vortex. Therefore, the perpendicular component of the magnetization illustrated in FIG. 4A has vanished as illustrated in FIG. 5A. As described above, it is general that static magnetic energy is strong at the center of the vortex so as to compensate for the exchange energy. However, if the vortex is pinned at the island-shaped non-magnetic portion, the associated portion is eliminated, so that the energy is moderated. Therefore, it may be presumed that the state where the vortex is pinned at any one of the island-shaped non-magnetic portions is relatively stable.

In general, the size of a vortex is expressed using it as a reference that an exchange interaction distance L which is a measure of an effective distance of an exchange interaction of a magnetic material. Namely, it is considered that the size at the center of the vortex where the magnetization changes to be in the perpendicular direction is substantially equal to the exchange interaction distance L. Herein, L is expressed by the following equation.

$$L = (\mu_0 A/Ms^2)^{0.5}$$

Wherein, A denotes an exchange stiffness constant (J/m); Ms denotes a saturated magnetization (T), and $\mu_0$ denotes a vacuum permeability=$1.257 \times 10^{-6}$ (H/m).

If the effective value of the diameter of the island-shaped non-magnetic portion is smaller than L, the action that the island-shaped magnetic portion pins the vortex is reduced, so that the effect of the invention is reduced.

In addition, if the effective value of the diameter of the island-shaped non-magnetic portion is substantially equal to the size of the entire vortex, the magnetic interaction around the island-shaped non-magnetic portion decreases, so that it is difficult to sustain the vortex structure. Due to the effect, the upper limit of the practical value of the diameter of the island-shaped non-magnetic portion is about 20 L.

Therefore, the effective value of the diameter D of the island-shaped non-magnetic portion is preferably in the range of $L \leq D \leq 20L$, more preferably in the range of $6L \leq D \leq 18L$.

In addition, as for the radius R of the circle A which is concentric with a circle of the outer shape of the magnetic film and on which the plural island-shaped non-magnetic portions are disposed, when the radius R is large, toward the outer edge of the spin valve magnetic film, the potential energy becomes larger. Accordingly, it is difficult for the vortex to reach the island-shaped non-magnetic portion. In addition, even though the vortex can reach the island-shaped non-magnetic portion and is pinned there, since the pinning energy is weak, the stability may be lowered. Conversely, when the radius R of the circle is small, the vortex is firmly pinned at the island-shaped non-magnetic portion and it is difficult for the vortex to move. In addition, practically, since there is a limit in the distance between the island-shaped non-magnetic portions, there is a problem in that the value of the diameter D of the island-shaped non-magnetic portion may not be increased.

Therefore, a preferable range exists in a concentric circle on which the plural island-shaped non-magnetic portions are disposed. More specifically, the radius R is preferably in the range of $0.2RR \leq R \leq 0.9RR$, more preferably, in the range of $0.3RR \leq R \leq 0.6RR$. Herein, RR denotes an effective radius of the spin valve element (=((Area of Spin Valve Element)/$\pi)^{0.5}$).

As a method of driving the spin valve element, an in-plane magnetic field is applied to the free layer, so that the vortex can move from one island-shaped non-magnetic portion to another island-shaped non-magnetic portion. The vortex is generally moved in the direction perpendicular to a magnetic field. For this instance, particularly, if the direction of the in-plane magnetic field is not aligned with the direction including two island-shaped non-magnetic portions (in-plane symmetric axis of the magnetic film), vibration in the transverse direction is added to the motion of the vortex. As a result, the vortex performs a meandering motion as a whole. Therefore, two-dimensional motion can be caused by one-axis magnetic field, so that it is possible to realize movement of the vortex between the island-shaped non-magnetic portions two-dimensionally distributed in the in-plane of the magnetic material.

In addition, the rotational motion of the vortex can be achieved by the application of the perpendicular magnetic field to the free layer of the spin valve element or the spin injection originating from the spin-polarized current. As a result, the vortex may move around through the island-shaped non-magnetic portions arranged along the circumference of the circle A from one to another.

In the example of the invention illustrated in FIG. 3, a basic form of the in-plane profile of the magnetic film constituting the free layer 25 is a circle, and within the circle four island-shaped non-magnetic portions $I_N$, $I_E$, $I_W$, and $I_S$ are formed along the circumference of a concentric circle of the magnetic film. In the description hereinafter, a material of the magnetic film is $Co_{57}Fe_{31}B_{12}$ that is Material 1 in Table 1, the size of the magnetic film is 100 nm in diameter and 20 nm in thickness. As the island-shaped non-magnetic portions, four hollow holes having a diameter of 20 nm are formed along the circumference of a concentric circle having a radius of 28 nm. In addition, for convenience of the description, the directions in the magnetic film are defined by E, S, W, and N as illustrated in the right portion of FIG. 3, which are used as subscript notations for island-shaped non-magnetic portions.

TABLE 1

| | Material | | |
|---|---|---|---|
| | 1 $Co_{57}Fe_{31}B_{12}$ | 2 $Co_{60}Fe_{20}B_{20}$ | 3 $Ne_{78}Fe_{22}$ |
| Ms Saturated Magnetic Field (T) | 1.90 | 1.08 | 0.86 |
| Ku Magnetic Anisotropy (J/m³) | 1.4E+03 | 2.40E+02 | 1.7E+00 |
| A Exchange Coupling Stiffness (J/m) | 1.30E−11 | 1.30E−11 | 1.30E−11 |
| L Exchange Distance (nm) = $(\mu_0 A/Ms^2)^{0.5}$ | 2.1 | 3.7 | 4.7 |
| 20L (nm) | 42.6 | 74.9 | 94.0 |

[Write Operation]

Figure 6:
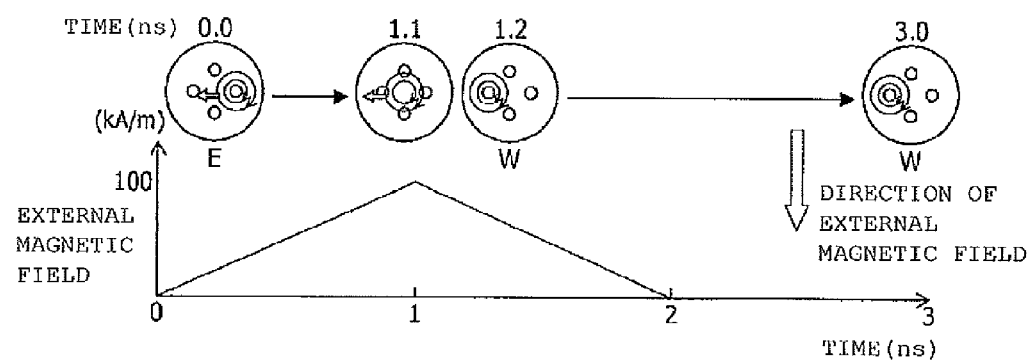
FIG. 6 is a view for explaining one example of magnetization behavior in the case in which an external magnetic field is applied to a spin valve element according to the invention in a direction aligned with an in-plane symmetric axis of the spin valve element.

In the stabilized magnetization state of the magnetic film, for example, as illustrated in FIG. 6, a vortex is pinned at an island-shaped non-magnetic portion ($I_E$ in FIG. 6). If an external in-plane magnetic field is applied, for example, in the S direction as illustrated to the magnetic film that is in the stabilized magnetization state, the distribution of magnetization moves in the direction perpendicular to the external magnetic field and thus the vortex reaches the island-shaped non-magnetic portion $I_W$ as illustrated in FIG. 6. The direction of movement is determined based on a relationship between the external magnetic field and the rotational direction of the vortex that is a clockwise direction or a counter-clockwise direction (that is, chirality of the vortex). In the above example, the rotational direction of the vortex rotates is clockwise and movement of the vortex is achieved in a direction heading toward the island-shaped non-magnetic portion $I_W$ from the island-shaped non-magnetic portion $I_E$.

Figure 7:
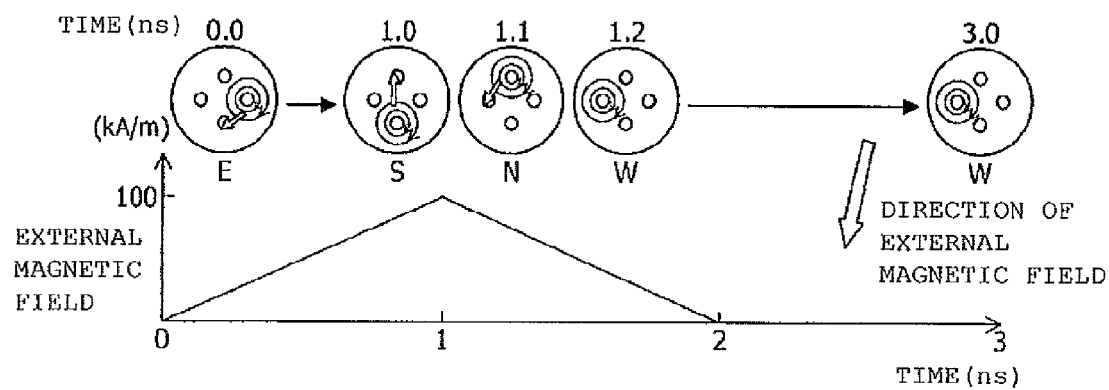
FIG. 7 is a view for explaining one example of magnetization behavior in the case in which an external magnetic field is applied to a spin valve element according to the invention in a direction aligned with an in-plane symmetric axis of the spin valve element (having an angel of about 6° to the W direction).

Next, FIG. 7 illustrates a change of the distribution of magnetization in the case in which the direction of the external in-plane magnetic field is changed by about 6° from the S direction to the W direction. If such an external magnetic field is used, the vortex that has been pinned at the island-shaped non-magnetic portion of a position $I_E$ moves in the order of $I_E \rightarrow I_S \rightarrow I_N \rightarrow I_W$, so that the vortex is finally pinned at to the island-shaped non-magnetic portion $I_W$. In this manner, if an external in-plane magnetic field is applied, the vortex basically moves in the direction perpendicular to the direction of the external in-plane magnetic field. However, since the direction of the magnetic field is configured to deviate from the in-plane symmetric axis of the magnetic film that lies is in the direction including two in-plane dots, vibration motion in the perpendicular direction is added to the rectilinear motion of the vortex in the main direction of the movement. As a result, the vortex performs a meandering motion as a whole, so that the vortex can be moved to an island-shaped non-magnetic portion which is not linearly arranged with the previous position.

FIG. 7 illustrates the case where the external in-plane magnetic field is sufficiently large. Even in the case, by adjusting the strength or application time of the external magnetic field, the vortexes can be pinned at the island-shaped non-magnetic portions $I_S$ and $I_N$ in the middle of movement. In this manner, by using the in-plane magnetization of which the direction is not aligned with the direction passing through the island-shaped non-magnetic portions $I_S$ and $I_N$, it is possible to increase the number of the island-shaped non-magnetic portions that can pin the vortexes.

Figure 8:
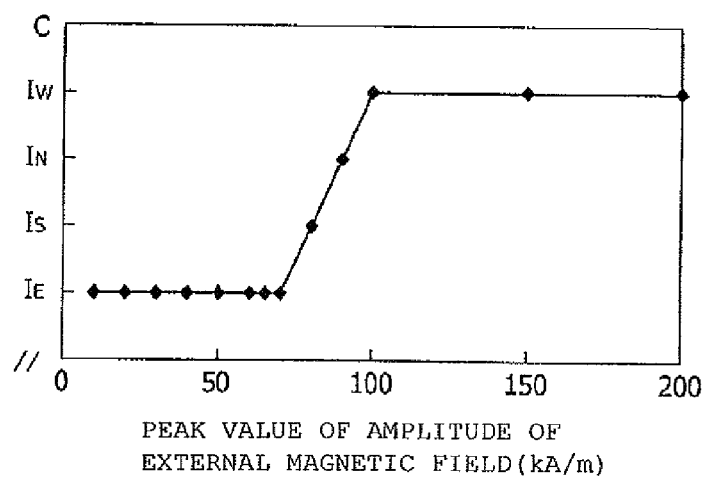
FIG. 8 is a view for explaining a relationship between an external magnetic field and a vortex stabilized site in a spin valve element according to the invention.

FIG. 8 illustrates a relationship between a peak value of the external magnetic field pulse and a position of the island-shaped non-magnetic portion at which the vortex is pinned after the ending of the pulse, in the spin valve element illustrated in FIG. 7. In this case, since the vortex unidirectionally moves, for example in the direction of $I_E \rightarrow I_S \rightarrow I_N \rightarrow I_W$. Accordingly, in order to achieve an inter-movement (for example, $I_N \rightarrow I_E$) among the four island-shaped non-magnetic portions, a reverse directional magnetic field (magnetic field reversal) or an intersecting magnetic field need to be applied. In other words, if there are two magnetic fields of different directions used, it is possible to move the vortex freely among the four island-shaped non-magnetic portions. In addition, in the vertical axis of the graph in FIG. 8, the symbol "C" denotes the case where a vortex lies at the center of the in-plane profile of the magnetic film 25, and the symbol "//" denotes the case where the vortex of magnetization has vanished and a parallel magnetization is formed.

Figure 9:
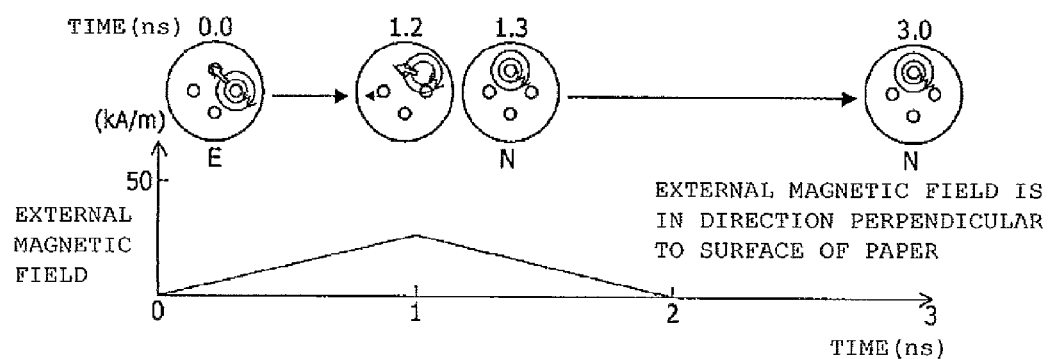
FIG. 9 is a view for explaining one example of magnetization behavior in the case in which an external magnetic field is applied to a spin valve element according to the invention in a direction perpendicular to the in-plane of the spin valve element.

In addition, FIG. 9 illustrates a case where an external magnetic field is applied to the magnetic film in the perpendicular direction. In this case, the vortex performs a rotational motion, so that the vortex moves from the island-shaped non-magnetic portion $I_E$ to the island-shaped non-magnetic portion $I_N$. In this manner, a single time movement of the vortex between the neighboring island-shaped non-magnetic portions can be performed using a single pulse. Accordingly, by continuously applying such a pulse, it can be achieved that the vortex is caused to revolve along the circumference of the circle A and the vortex is pinned at an arbitrary island-shaped non-magnetic portion. If a unipolar current is used, an operation in a single rotational direction (in the above example, counter-clockwise rotation) can be performed. If a bipolar current is used, an operation in the reverse rotational direction can also be performed.

In addition to the application of the perpendicular magnetic field described above, the rotation of the vortex illustrated in FIG. 9 can also be performed by using the spin injection (see B. A. Ivanov et al., "Excitation of Spin Dynamics by Spin-Polarized, Current in Vortex State Magnetic Disks," Phys. Rev. Lett. No. 99, 247208, The American Physical Society, Dec. 14, 2007) from the pinned layer having a perpendicular magnetic anisotropy or the spin injection (see J. Shibata et al., "Current Induced Magnetic Vortex Motion by Spin-Transfer Torque," Phys. Rev. B. No. 73, 020403, The American Physical Society, Jan. 4, 2006) based on the in-plane current of the free layer. As for the movement of the vortex among the island-shaped non-magnetic portions based on the rotational motion, it is configured such that the vortex can be sequentially moved through neighboring island-shaped non-magnetic portions, and as described above, the vortex can be to be moved through all the island-shaped non-magnetic portions by a unipolar current. Accordingly, this is particularly preferably used.

In addition, it has been known that magnetization of a vortex is reversed with respect to a magnetic layer at a current exceeding a threshold value. If this phenomenon is used, it is possible to double the recording state.

In addition, although the distribution of magnetization in the free layer is changed by the external magnetic field, since the pinned layer has large coercivity, the distribution of magnetization in the pinned layer can be remained unchanged. Therefore, the control of electrical resistance of a spin valve element can be achieved by controlling only the distribution of magnetization in the free layer, which leads to realization of a recording element performing the multi-value recording.

[Read Operation]

Figure 10A:
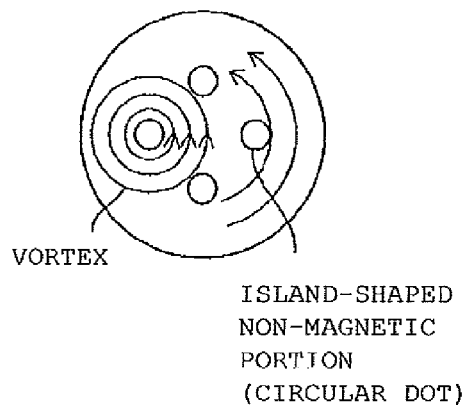
Figure 10B:
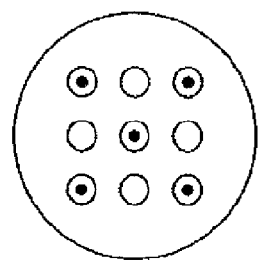
Figure 10C:
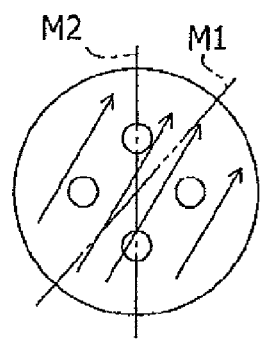

On the other hand, in order to read a position of the vortex in the free layer, it is necessary to detect magnetoresistance between the free layer and the pinned layer having an in-plane magnetic anisotropy. FIGS. 10A, 10B and 10C illustrate a distribution of magnetization for explaining the read operation. Although, the free layer has the distribution of magnetization here the vortexes exist as illustrated in FIG. 10A and the vortexes are pinned at whichever island-shaped non-magnetic portion, as illustrated in FIG. 10B, the magnetoresistance between the free layer and the pinned layer having a perpendicular magnetic anisotropy does not vary. On the other hand, as illustrated in FIG. 10C, the magnetoresistance between the free layer and the pinned layer having an in-plane magnetic anisotropy varies depending on at which island-shaped non-magnetic portion vortex is pinned. Therefore, by using the feature, the position of the vortex can be detected. For this instance, as indicated by the dot-dashed line M1 in FIG. 10C, if the direction of the magnetization of the pinned layer is aligned with the symmetric axis, the values of the magnetoresistance in the case in which the vortexes lie at the island-shaped non-magnetic portions $I_E$ and $I_S$ among the four island-shaped non-magnetic portions are equal to each other. The values of the magnetoresistance in the cases where the vortexes lie at the island-shaped non-magnetic portions $I_N$ and $I_W$ are equal to each other while they are different from the values of the magnetoresistance in the cases where the vortexes lie at the island-shaped non-magnetic portions $I_E$ and $I_S$. Therefore, only the two-value recording is available. In addition, as indicated by the dot-dashed line M2 in FIG. 10C, if the direction of the magnetization of the pinned layer is aligned with the symmetric axis, the values of the magnetoresistance in the cases where the vortexes lie at the island-shaped non-magnetic portions $I_N$ and $I_S$ among the four island-shaped non-magnetic portions are equal to each other. Therefore, only the three-value recording is available with the magnetoresistance in the case in which the vortex lies at the island-shaped non-magnetic portion $I_E$ and the magnetoresistance in the case in which the vortex lies at the island-shaped non-magnetic portion $I_W$. In even this case, the effects of the invention are obtainable. However, it is preferable that, so as not to reduce the effect of the multi-valued writing, the direction of the magnetization of the pinned layer is not aligned with the symmetric axis of the in-plane profile of the pinned layer. In addition to the dot-dashed lines M1 and M2, there are three other symmetric axes equivalent to the dot-dashed lines M1 and M2.

Figure 11A:
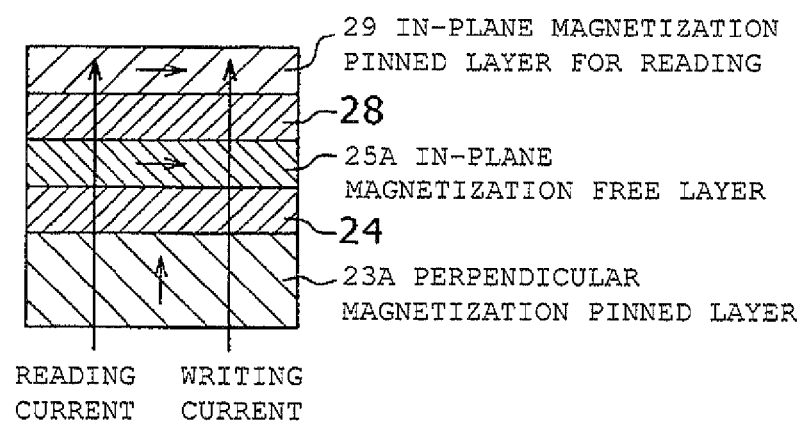
Figure 11B:
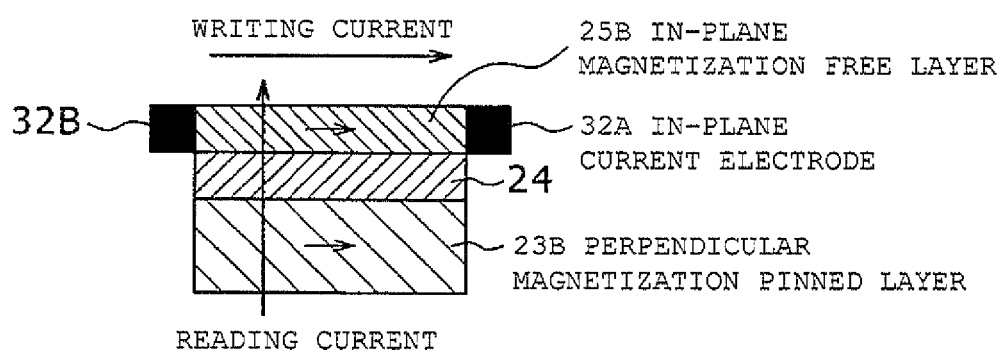

As described above, in the case in which the vortex is caused to move in the free layer from the pinned layer (FIG. 10B) having a perpendicular magnetic anisotropy by the spin injection, it is necessary to incorporate a pinned layer for reading which has an in-plane magnetic anisotropy to read the magnetoresistance. FIGS. 11A and 11B illustrate examples of the structure of a spin injection type spin valve element according to one embodiment of the invention. FIG. 11A illustrates an example of the structure having a perpendicular magnetization pinned layer for writing and an in-plane magnetization pinned layer for reading, and FIG. 11B illustrates an example of the structure having an in-plane spin injection electrode and an in-plane magnetization pinned layer.

As illustrated in FIG. 11A, a serial structure may be used in which an in-plane magnetization free layer 25A is interposed between a pinned layer for writing (perpendicular magnetization pinned layer) 23A that has a perpendicular magnetic anisotropy and a pinned layer for reading (in-plane magnetization pinned layer for reading) 29 that has an in-plane magnetic anisotropy. In addition, in the case in which the rotation of the vortex caused by the spin injection originating from the in-plane current of the free layer is used, a structure having writing electrodes (in-plane current electrodes) 32A and 32B serving as terminals for the in-plane current of the free layer is considered as illustrated in FIG. 11B. Also shown in FIG. 11B are an in-plane magnetization free layer 25B and a perpendicular magnetization pinned layer 23B.

Particularly, what at which island-shaped non-magnetic portion the vortex is pinned can be controlled by the strength or application time of the applied external magnetic field. As a result, a number of the stabilized states as many as the number of the island-shaped non-magnetic portions are implemented, so that the multi-value recording element can be realized. As the more important feature of the invention, if the rotation of the vortex caused by the spin injection is used, the vortex can be pinned at any one of the island-shaped non-magnetic portions by a unidirectional current. In other words, in a conventional spin valve element, bipolar currents including positive and negative currents are needed. However, in the element according to the invention, the element can be controlled by only a unipolar current at the writing time.

[Procedure of Manufacturing of Element]

Hereinafter, an example of a procedure of manufacturing a TMR type spin valve element is described. The below-described materials and thicknesses of layers are exemplarily provided.

On a substrate 5 such as a silicon wafer with an oxide layer attached thereto, a Cu film (30 nm) as an electrode layer 21 is formed, and then a CoFeB film (35 nm) as a ferromagnetic layer 23, an MgO film (0.6 nm) as an insulating layer 24, a CoFeB film (20 nm) as a ferromagnetic layer 25, and a Cu film (2 nm) as a capping layer 26 are sequentially stacked. In addition, a negative resist is coated, patterning by electron beam exposure or the like is performed, and ion milling or dry etching is performed thereby to form a circular spin valve element having circular dots serving as the island-shaped non-magnetic portions. Particularly, in the case in which the resolution is insufficient for the process of forming minute circular dots with the electron beam exposure, patterning by extreme ultraviolet exposure needs to be performed. In addition, an $SiO_2$ film is formed by a CVD method to cover the side surface of the circular spin valve element, and then the resist on the spin valve element is removed by a liftoff process thereby to form an upper electrode. Next, the magnetization easy axis of the pinned layer is determined by performing annealing at a temperature in the range of 350 to 500° C. under the magnetic field of several kOe.

In addition, particularly, as illustrated in FIG. 11A, when forming the pinned layer for reading, the same processes as the above are performed except that, after the ferromagnetic layer 25 is formed with use of TbFeCo which is prone to have a perpendicular magnetization as the ferromagnetic layer 23, an MgO layer and a CoFeB layer (20 nm) which is to serve as the pinned layer for reading are formed. In addition, in the case of forming a GMR type spin valve element, except that a non-magnetic layer 51 made of Cu or the like is used instead of the insulating layer 24, basically the same manufacturing processes are used.

With respect to materials constituting the spin valve element according to the invention, as the substrate 5, a silicon substrate and a glass substrate can be used. In addition, a copper substrate having a high functionality as a heat sink can be also used. In addition, if necessary, a mechanism of cooling such as water-cooling or the like may be performed. As the electrode layers 21, 29, and 31, Ta, Pt, Cu, Au, Ag, Al, or Mo may be used. As the anti-ferromagnetic layer 22, IrMn or PtMn may be used. As the ferromagnetic layer (pinned layer) 23, CoFe, CoFeB, or TbFe, TbFeCo, GdFe, GdFeCo, FePt, Co/Pt multi-layered structure, Co/Pd multi-layered structure, or the like, which is easy to obtain the perpendicular anisotropy may be preferably used. As the pinned layer for reading, CoFe or CoFeB may be used. As the insulating layer 24, MgO or an Al oxide may be used.

As the non-magnetic layer 51, Cu may be used. As the ferromagnetic layer (free layer) 25, in addition to CoFe and CoFeB which are typical materials for the ferromagnetic layer, NiFe having a small crystalline anisotropy may be preferably used. However, the invention is not limited thereto. In addition, Cu and Pd are mentioned as representative examples of a material for the capping layer 27, but the invention is not limited thereto. In addition, any non-magnetic material may be used for the circular dot. On the other hand, the simplest way of obtaining the circular dot is to pattern a spin valve magnetic layer to form holes in the layer and fills the holes with an insulating material such as $SiO_2$.

In order to enable the spin valve element to exhibit its intrinsic function, the coercivity of the ferromagnetic layer (pinned layer) 23 needs to be larger than that of the ferromagnetic layer (free layer) 25. In this method, the ferromagnetic layer (pinned layer) 23 and the ferromagnetic layer (free layer) 25 are constructed with the same material, and the thickness of the former is configured to be larger than that of the latter so that the difference in the coercivity can be generated. In addition, an anti-ferromagnetic layer (pinning layer) 22 is provided so that the coercivity of the ferromagnetic layer (pinned layer) 23 can also be increased by an anti-ferromagnetic coupling therebetween. In addition, if necessary, for example, CoFeB/Ru/CoFeB or the like may be provided as an anti-ferromagnetic coupling layer. The crystallization or the magnetization easy axis direction of each layer including the pinned layer is controlled by performing annealing under a magnetic field after the lamination thereof.

Analytical examples together with the above examples are listed in Table 2. Three magnetic materials are set as listed in Table 1, and the size of the free layer is set as listed in Table 2. The external magnetic field and the spin injection are set with a single triangular wave pulse having a rising edge of 1 ns and a falling edge of 1 ns. In addition, in Table 2, the movement of the vortex is indicated by only the directions (S, W, E, and N).

Figure 12:
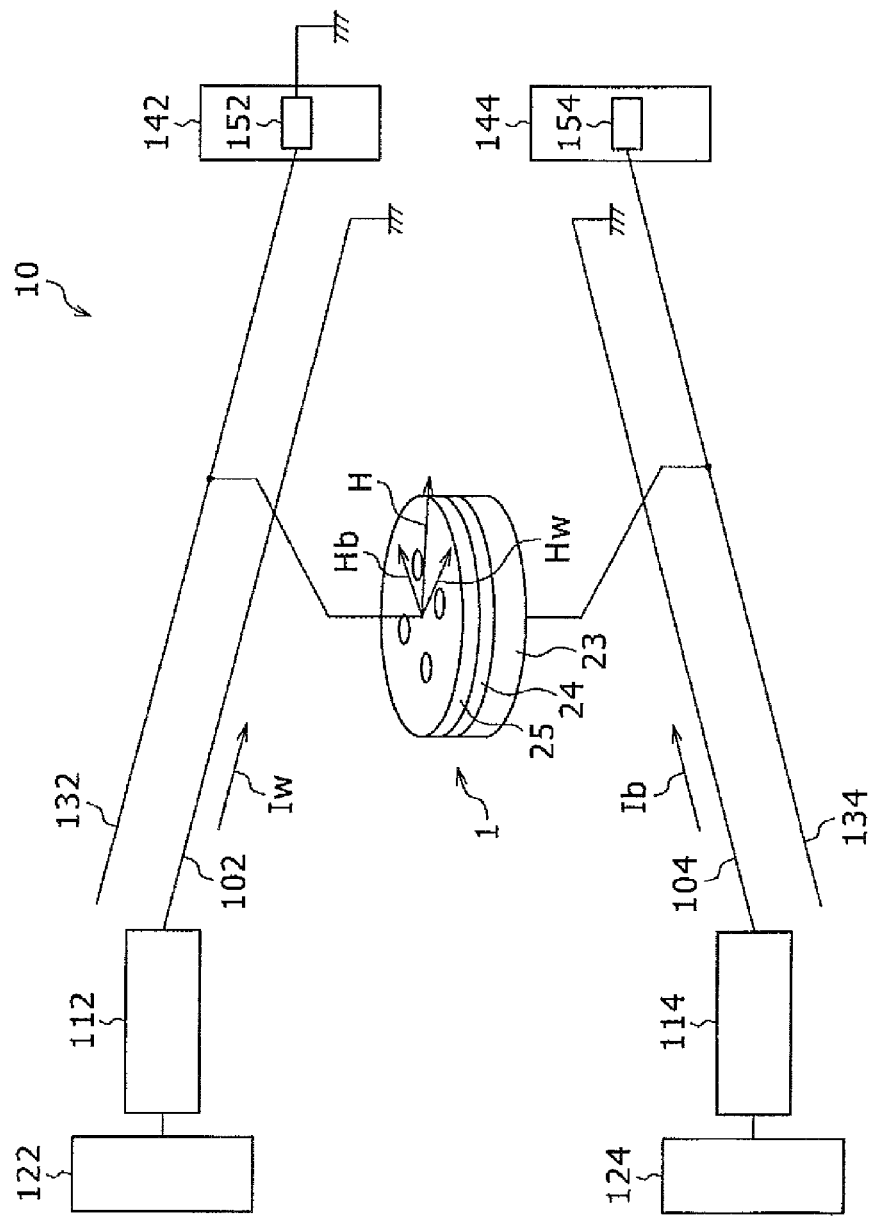
FIG. 12 is a view for explaining a configuration of a storage device using a spin valve element according to the invention.

In any one of the analytical examples 1 to 12, by the external magnetic field pulse or the spin injection pulse, the vortex is caused to move from one circular dot to another circular dot, and the vortex is stably pinned at the circular dot serving as a target of the movement at the ending of the pulse. In the analytical examples 3, 5, 6, and 12, although the vortex moves between three circular dots, it is obvious that the vortex can be moved between all the four circular dots by a combination with other external magnetic field directions. In addition, particularly, the current value required for the movement of the vortex due to the spin injection is ranging from 11 to 120 µA, which also depends on the size of a magnetic material or a spin valve element. With respect to a current density, it ranges from $6.3 \times 10^4$ to $1.4 \times 10^5$ A/cm². In comparison with a current density of $>1 \times 10^6$ A/cm² for a conventional magnetization reversal type spin valve element, the current density described above is a very small value, which is one of the characteristics of this method.

pinned layer 23, an intermediate layer 24, and a free layer 25 are illustrated, but a configuration of electrical wiring for addressing these components and other detailed configurations are omitted. In addition, in an actual storage device, a large number of the spin valve elements 1 are disposed in an array, but FIG. 12 illustrates only one of the spin valve elements.

TABLE 2

|  | analytical example 1 | analytical example 2 | analytical example 3 | analytical example 4 | analytical example 5 | analytical example 6 | analytical example 7 | analytical example 8 |
|---|---|---|---|---|---|---|---|---|
| Material of Free Layer | 1 | 1 | 1 | 1 | 1 | 1 | 1 | 1 |
| Diameter of Film (nm) | 100 | 100 | 100 | 100 | 100 | 100 | 100 | 100 |
| Thickness of Film (nm) | 20 | 20 | 20 | 25 | 20 | 20 | 20 | 20 |
| Number of Circular Dots | 4 | 4 | 4 | 4 | 4 | 4 | 4 | 4 |
| Diameter of Circular Dot (nm) | 20 | 20 | 20 | 20 | 20 | 20 | 13 | 13 |
| Radius of Circle of Circular dot (nm) | 28 | 28 | 28 | 28 | 28 | 28 | 28 | 19 |
| Direction of External Magnetic Field | In-Plane S Direction | In-Plane S Direction (Slanted by 6° from W) | In-Plane S Direction (Slantled by 61° from W) | In-Plane S Direction (Slanted by 6° from W) | In-Plane W Direction | In-Plane SW Direction (Center between S and W) | In-Plane S Direction (Slanted by 6° from W) | In-Plane S Direction (Slanted by 6° from W) |
| Peak Value of External Magnetic Field (kA/m) | 100 | 100 | 90 | 80 | 100 | 100 | 100 | 100 |
| Spin Injection Current (µA) | 0 | 0 | 0 | 0 | 0 | 0 | 0 | 0 |
| Movement of Vortex | E->W | E->S->N->W | E->S->N | E->S | E->W->N | E->S->W | E->S->N->W | E->S->N->W |
| Remarks | FIG. 6 | FIG. 7 | FIG. 8 | FIG. 8 |  |  |  |  |

|  | analytical example 9 | analytical example 10 | analytical example 11 | analytical example 12 | analytical example 13 | analytical example 14 |
|---|---|---|---|---|---|---|
| Material of Free Layer | 1 | 1 | 1 | 2 | 2 | 3 |
| Diameter of Film (nm) | 100 | 100 | 100 | 200 | 200 | 500 |
| Thickness of Film (nm) | 20 | 20 | 20 | 40 | 40 | 80 |
| Number of Circular Dots | 4 | 4 | 4 | 4 | 4 | 4 |
| Diameter of Circular Dot (nm) | 13 | 13 | 13 | 50 | 50 | 80 |
| Radius of Circle of Circular dot (nm) | 31 | 28 | 28 | 56 | 56 | 100 |
| Direction of External Magnetic Field | In-Plane S Direction (Slanted by 6° from W) | Perpendicular | — | In-Plane S Direction (Slanted by 12° from W) | — | — |
| Peak Value of External Magnetic Field (kA/m) | 100 | 25 | 0 | 100 | 0 | 0 |
| Spin Injection Current (µA) | 0 | 0 | 11 | 0 | 30 | 120 |
| Movement of Vortex | E->S->N->W | E->N | E->N | E->S->W | E->N | E-N |
| Remarks |  | FIG. 9 |  |  |  |  |

Hereinbefore, according to the invention, it is possible to provide a multi-value recording element having a high recording density and a method of driving the same and to provide means for reducing a driving current.

FIG. 12 illustrates a configuration of a storage device using a spin valve element according to the invention. The spin valve element 1 has an in-plane profile illustrated in FIG. 3 and a layer structure illustrated in FIG. 1. In FIG. 12, only a In the spin valve element 1 of the storage device 10, magnetic field generating word wirings 102 and magnetic field generating bit wirings 104, through which currents for generating an external magnetic field applied to the free layer 25 flow, are disposed in a matrix, and the wirings are connected to current driving circuits 112 and 114. The current driving circuits are connected to a word line decoder 122 and a bit line decoder 124. The current driving circuits 112 and 114 include current amplifying stages (not shown) which control current values according to command values from the connected decoders 122 and 124. With respect to the relative directions between the spin valve element 1 and the magnetic field generating word wiring 102 and the magnetic field generating bit wiring 104, the circular dots (island-shaped non-magnetic portions) are positioned such that the external magnetic field directs in a direction deviating from the S direction by 6° as illustrated in FIG. 7.

The current amplifying stages control the waveform of a current to flow through the wirings 102 and 104 according to the commands from the word line decoder 122 and the bit line decoder 124 in order to apply the currents $I_w$ and $I_b$ by which the external magnetic field for the writing is applied to only the to-be-updated spin valve element but is not applied to the other spin valve elements so that the writing is not performed in the other spin valve elements. In the embodiment, as for the control of the current waveform, a triangular waveform having rising and falling edges as illustrated in FIG. 7 or the like is applied, so that the state is updated according to the peak value thereof. For this reason, the current amplifying stages amplify triangular waveforms generated by a triangular wave generating circuit (not shown) so as to form current waveforms required for the connected word and bit wirings. A composite magnetic field H of the magnetic fields $H_w$ and $H_b$ formed in the free layer 25 by the currents $I_w$ and $I_b$ becomes the external magnetic field in each of the spin valve elements.

In the spin valve element 1 of the storage device 10, the free layer 25 and the pinned layer 23 are connected to each other so that the current is allowed to flow therebetween and the resistance value is detected therefrom. The function of the pinned layer 23 is to identify the resistance value by the current flowing between the pinned layer 23 and the free layer 25 at the time of reading data. Therefore, as described with reference to FIG. 10C, the magnetization of the pinned layer 23 is configured as the in-plane magnetization in the direction other than the symmetric axis. The wiring 132 and the wiring 134 are connected to the word line decoder 142 and the bit line decoder 144 for the detection. The bit line decoder 144 is connected to a current source (not shown) for generating a current for the detection and a current detection unit 154. The word line decoder 142 includes a switching unit 152 including a selection transistor in every word line.

In addition, in the above description, the write operation using the external magnetic field which has a variable triangular waveform having rising and falling edges is disclosed. However, the same write operation can also be implemented by the spin injection current which allows the similar torque to be applied. In this case, as illustrated in FIG. 12, the magnetic field generating word wiring 102, the current driving circuit 112, the decoder 122, and the magnetic field generating bit wiring 104, the current driving circuit 114, and the decoder 124 are not used. In addition, the spin injection current for the writing is caused to flow through the wiring 132 and the wiring 134 which are serially connected to the switching elements such as transistors and the spin valve element.

With respect to the read operation, if a read command is received, the word line decoder 142 first allows the selection transistor to connect the word line of the to-be-read word to the power supply or the ground and to disconnect the other words. With respect to the to-be-read word, since the word line 132 is connected to the power supply or the ground, the current or voltage from the bit line decoder 144 is applied to a target spin valve element, so that the current or voltage at this time can be detected.

Hereinbefore, as described with reference to the embodiments of the invention, the invention is not limited to the aforementioned embodiments, but various modifications, changes, and combinations are available based on the spirit of the invention.

The invention claimed is:

1. A spin valve element comprising:
   an intermediate layer including an insulating layer or a non-magnetic layer; and
   a pair of ferromagnetic layers sandwiching the intermediate layer, one of the pair of the ferromagnetic layers having a different coercivity from another of the pair,
   wherein at least the ferromagnetic layer having a smaller coercivity than the other of the pair has a substantially circular in-plane profile and a plurality of island-shaped non-magnetic portions disposed thereon.

2. The spin valve element according to claim 1, wherein an island-shaped non-magnetic portion has a substantially circular in-plane profile.

3. The spin valve element according to claim 1, wherein the plurality of the island-shaped non-magnetic portions are disposed on a circle having substantially a same center as an outer shape of the spin valve element.

4. A method of driving the spin valve element according to claim 1, comprising:
   moving a vortex in a vortex-shaped magnetization from one island-shaped non-magnetic portion to another island-shaped non-magnetic portion by applying an in-plane magnetic field to the ferromagnetic layer having the smaller coercivity.

5. The method according to claim 4, wherein a direction of the in-plane magnetic field is not aligned with a direction passing through two island-shaped non-magnetic portions.

6. A method of driving the spin valve element according to claim 1, comprising:
   moving a vortex in a vortex-shaped magnetization by applying a perpendicular magnetic field to the ferromagnetic layer having the smaller coercivity, so that the vortex has a rotational motion from a state where the vortex lies at one island-shaped non-magnetic portion to a state where the vortex lies at another island-shaped non-magnetic portion.

7. A method of driving the spin valve element according to claim 1, comprising:
   moving a vortex in a vortex-shaped magnetization by causing a current to flow so as to allow spin injection from the ferromagnetic layer having a larger coercivity to the ferromagnetic layer having the smaller coercivity, so that the vortex has a rotational motion from a state where the vortex lies in one island-shaped non-magnetic portion to a state where the vortex lies in a neighboring island-shaped non-magnetic portion.

8. A storage device using as a recording element the spin valve element according to claim 1.

9. A method of driving the spin valve element according to claim 2, comprising:
   moving a vortex in a vortex-shaped magnetization from one island-shaped non-magnetic portion to another island-shaped non-magnetic portion by applying an in-plane magnetic field to the ferromagnetic layer having the smaller coercivity.

10. A method of driving the spin valve element according to claim 3, comprising:
    moving a vortex in a vortex-shaped magnetization from one island-shaped non-magnetic portion to another island-shaped non-magnetic portion by applying an in-plane magnetic field to the ferromagnetic layer having the smaller coercivity.

11. The method according to claim 9, wherein a direction of the in-plane magnetic field is not aligned with a direction passing through two island-shaped non-magnetic portions.

12. The method according to claim 10, wherein a direction of the in-plane magnetic field is not aligned with a direction passing through two island-shaped non-magnetic portions.

13. A method of driving the spin valve element according to claim 2, comprising:
moving a vortex in a vortex-shaped magnetization by applying a perpendicular magnetic field to the ferromagnetic layer having the smaller coercivity, so that the vortex has a rotational motion from a state where the vortex lies at one island-shaped non-magnetic portion to a state where the vortex lies at another island-shaped non-magnetic portion.

14. A method of driving the spin valve element according to claim 3, comprising:
moving a vortex in a vortex-shaped magnetization by applying a perpendicular magnetic field to the ferromagnetic layer having the smaller coercivity, so that the vortex has a rotational motion from a state where the vortex lies at one island-shaped non-magnetic portion to a state where the vortex lies at another island-shaped non-magnetic portion.

15. A method of driving the spin valve element according to claim 2, comprising:
moving a vortex in a vortex-shaped magnetization by causing a current to flow so as to allow spin injection from the ferromagnetic layer having a larger coercivity to the ferromagnetic layer having the smaller coercivity, so that the vortex has a rotational motion from a state where the vortex lies in one island-shaped non-magnetic portion to a state where the vortex lies in a neighboring island-shaped non-magnetic portion.

16. A method of driving the spin valve element according to claim 3, comprising:
moving a vortex in a vortex-shaped magnetization by causing a current to flow so as to allow spin injection from the ferromagnetic layer having a larger coercivity to the ferromagnetic layer having the smaller coercivity, so that the vortex has a rotational motion from a state where the vortex lies in one island-shaped non-magnetic portion to a state where the vortex lies in a neighboring island-shaped non-magnetic portion.

17. A storage device using as a recording element the spin valve element according to claim 2.

18. A storage device using as a recording element the spin valve element according to claim 3.

* * * * *